United States Patent [19]

Lee et al.

[11] Patent Number: 5,208,470
[45] Date of Patent: May 4, 1993

[54] SEMICONDUCTOR MEMORY DEVICE WITH A STACKED CAPACITOR

[75] Inventors: Kyu-Pil Lee; Jong-Jik Park; Yun-Seung Shin, all of Suwon-city; Joon Kang, Seoul, all of Rep. of Korea

[73] Assignee: SamSung Electronics Co., Ltd., Suwon, Rep. of Korea

[21] Appl. No.: 738,132

[22] Filed: Jul. 30, 1991

[30] Foreign Application Priority Data

Feb. 25, 1991 [KR] Rep. of Korea .................. 1991-2988

[51] Int. Cl.$^5$ .............................................. H01L 29/68
[52] U.S. Cl. ........................................ 257/296; 257/305; 257/306
[58] Field of Search ................... 357/235, 236, 48, 50, 357/51

[56] References Cited

U.S. PATENT DOCUMENTS

| | | | |
|---|---|---|---|
| 4,994,889 | 2/1991 | Takeuchi et al. | 357/23.5 |
| 5,017,982 | 5/1991 | Kobayashi | 357/23.6 |
| 5,068,707 | 11/1991 | Pors et al. | 357/23.6 |

Primary Examiner—Edward Wojciechowicz
Attorney, Agent, or Firm—Robert E. Bushnell

[57] ABSTRACT

The semiconductor memory device with a stacked capacitor is disclosed. When the mis-align is generated in forming contact region 42 for contact between the storage electrode of the stacked capacitor and the source region 34, the ion-implantation process, with the same conductive type as that of the source region, is carried out, to form the another source region 48 under the bottom surface of the contact region 42, wherein the polysilicon layer on the substrate is used as the mask. The successive ion-implantation provides the diffusion region 58 capable of wholly surrounding the another source region 48, wherein the diffusion region 58 contains higher concentration than that of the substrate and simultaneously lower than that of the source region, with the same conductive type as that of substrate. On the other hand, when no mis-align is generated, the semiconductor memory device further comprises another diffusion region 58a formed below the source region 34a, the diffusion region 58a having the opposite conductive type to that of the source region. Thereby the memory device is provided with the improvement of the refresh characteristic and with decrease of the soft error rate.

13 Claims, 3 Drawing Sheets

SEMICONDUCTOR MEMORY DEVICE WITH A STACKED CAPACITOR

BACKGROUND OF THE INVENTION

The present invention generally relates to a dynamic random access memory (DRAM) in a semiconductor memory device, and more particularly, to a structure of a diffusion layer in contact with a storage node of DRAM provided with a stacked capacitor.

Most of DRAM devices are provided with a plurality of memory cells each having one transistor and one capacitor. An amount of 10 the electric charges accumulated in the capacitor of the memory cell determines either one state of logic "low", i.e., "0" or logic "high", i.e., "1", which state is stored into the capacitor and then read out through the transistor. Here, the more the amount of the accumulated charges is, the better the sensing operation of information in the memory device is. Thus, to enhance the device performance, the capacitance of the capacitor should be made as large as possible. This is accomplished by increasing the plate area of the capacitor or decreasing the plate spacing thereof, under a given available dielectric constant of the dielectric. The decrease of the plate spacing of the capacitor, however, has itself the limit. Also the plate area thereof is minimized in proportional to the decrease of device area occupied by the high-density memory device. As a result, if the plane capacitor is employed in the high-density memory devices, the capacitance suitable for high-density memory device is not achieved. In attempt to solve this problem, the trench capacitor, in three-dimension, formed in a substrate, and the stacked capacitor, in three-dimension, formed on the substrate are contrived.

Referring to FIG. 1 illustrating the layout of the semiconductor memory device with a stacked capacitor, an active region 2 and a word line 4 are respectively extended in horizontal direction and vertical direction. A first and a second contact regions 6, 8 are disposed over the active region 2. A bit line 10 is extended in horizontal direction, with being contacted with the second contact region 8. Also a storage electrode region 12 is disposed over the active region 2, with being contacted with the first conducting region 6. A plate electrode region 14, wholly covering the storage electrode region 12, is disposed over the storage electrode region 12.

FIG. 2 illustrates the cross sectional view of the FIG. 1. A source and drain regions 16, 18, separated from each other by a channel region over the substrate, are formed in the substrate of a first conductivity type having first and second field oxide layers 21, 22. A gate, served as a word line, is disposed on a gate insulation layer 24, as an interlayer, covering the channel region. The top surface of the substrate except for the first and second contact regions 6, 8 is covered with an insulating layer 26. The bit line 10 of a metal film and the storage electrode 12 made of a first polysilicon layer are respectively in contact with the second contact region 8 and the first contact region 6. The plate electrode 14 made of a second polysilicon covers the whole storage electrode 12 formed on a dielectric layer 28. The MOS transistor of DRAM is constituted by the source and drain regions 16, 18 and the gate 4. The capacitor thereof is constituted by the storage electrode 12, the dielectric layer 28 and plate electrode 14.

When the density scale of the memory cells is not large enough and the tolerance for the process margin is large, the first contact region 6 is formed within the source region 16, as shown in FIG. 2. In case where the distance between the elements of memory cells, however, is decreased in proportional to the increase of the density of the memory cell, the distance between the one side of the first contact region 6 and the field oxide layer adjacent thereto is less than a micron. Thus, the mask process, in manufacturing the memory cell, requires a very critical alignment process. In the practical process for forming the high-density memory cell, however, the first contact region 6 may be formed outside of the source region because of the mis-align according to the decrease of the process margin.

FIG. 3 illustrates the cross sectional view of the conventional memory cell having an undesirable structure caused by the mis-alignment. As shown in FIG. 3, the mask pattern for forming the first contact region is shifted toward the first field oxide layer 21. The first contact region 6 intrudes part of the first field oxide layer 21. That is, part of the contact region positioned outside of the source region 16 comes in contact with the substrate 20 of the first conductivity type with a low concentration, to thereby form a second contact region of a relatively weak junction, in comparison with the junction between 10 the source region of a high concentration and the substrate. Through the second contact region, the current accumulated in the storage electrode comes to leak and to degrade the characteristic of the refresh operation. On the other hand, the α particles radiated from uranium and thorium contained in package material for use in seal of the memory chips, collide with the lattice in the substrate, to generate holes and electrons. The generated holes and electrons cause the data, injected into and stored in the storage region through the second contact region, to be inverted. This phenomenon is called soft error. The soft error rate increases with the minimization of the memory device, so that the reliability of the operation of the memory cell is reduced. Thus, the problems of leakage current and soft error shall be resolved in order to realize the high-density memory device having high reliability.

SUMMARY OF THE INVENTION

It is an object of the present invention to provide a semiconductor memory device having an improved refresh operation characteristic.

It is another object of the present invention to provide a semiconductor memory device capable of controlling the soft error.

In achieving the object, a substrate, having a contact region formed thereon and being in contact with a storage node, is subjected to an ion-implantation with the same conductivity type as that of the source region, thereby a source region is extended up to one side surface of an field oxide layer adjacent thereto. Thus, an entire bottommost surface of the extended contact region is surrounded.

Also in achieving another object, an diffusion region of the opposite conductivity type to that of the source region is formed, under the source region contacted with the storage node.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF PREFERRED EMBODIMENTS

Figure 1:
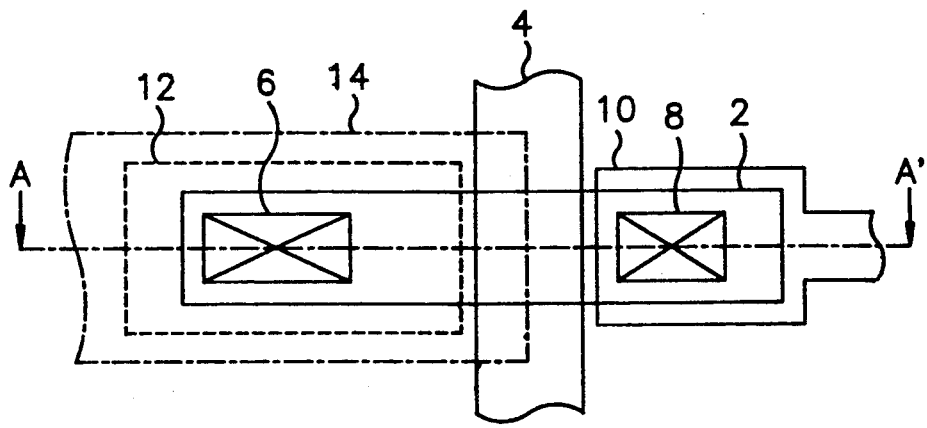
FIG. 1 illustrates the general layout of the semiconductor memory device provided with the staked capacitor.
Figure 2:
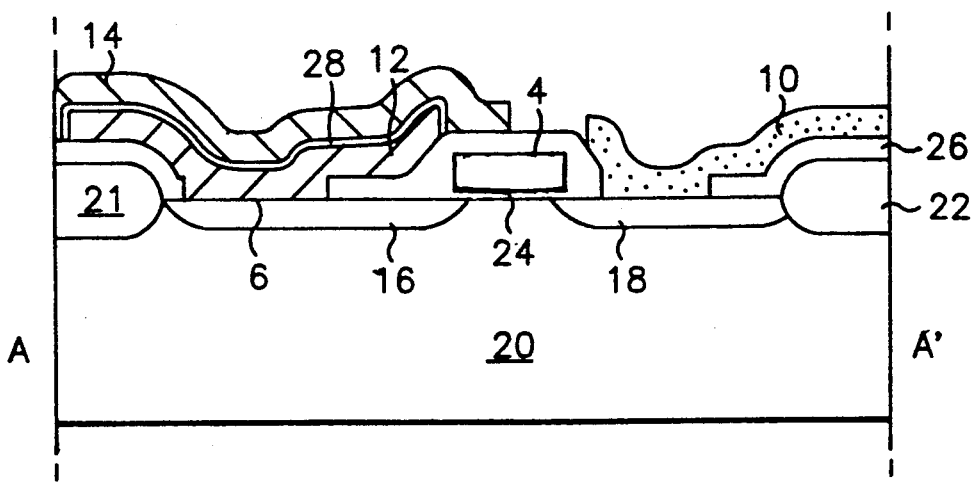
FIG. 2 illustrates the cross sectional view of the FIG. 1.
Figure 3:
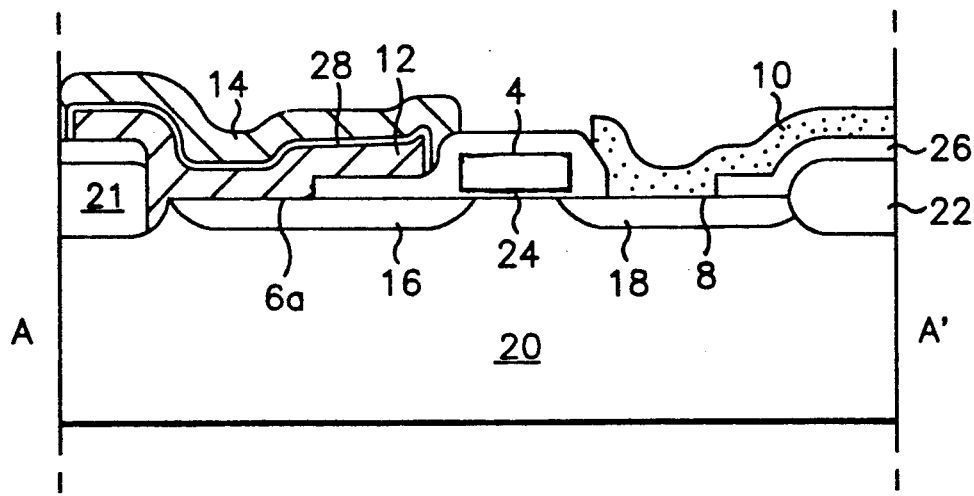
FIG. 3 is the cross sectional view illustrating the conventional mis-align problem.
Figure 4:
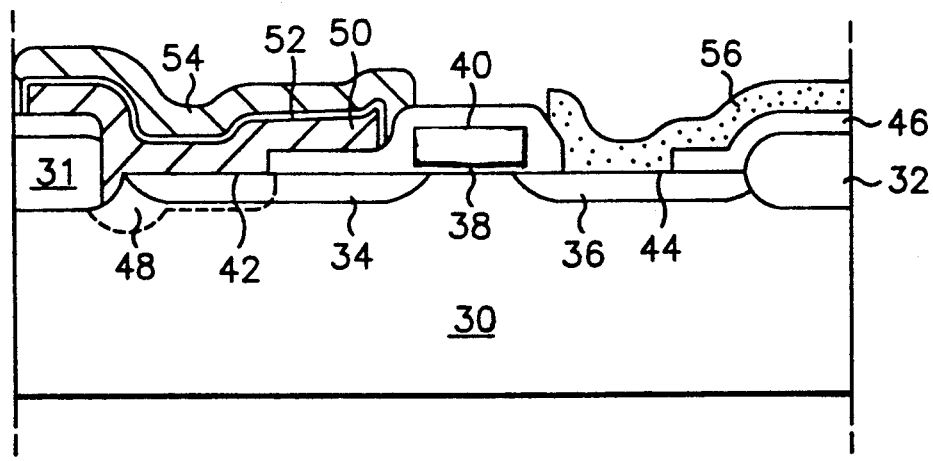
FIG. 4 illustrates an embodiment according to the present invention.

FIG. 4 illustrates the cross sectional view of the embodiment according to the present invention, when mis-alignment is generated during the manufacture of the DRAM having the layout of the FIG. 1. As shown in FIG. 4, a first and a second field oxide layers 31, 32, a first source and drain regions 34, 36, a gate insulating layer 38, a gate 40 and an insulating interlayer 46 are sequentially formed over the substrate 30 of the first conductivity type. After forming the patterns for apertures corresponding to first and second contact regions 42, 44, selective etching of the insulating interlayer 46 is carried out, until the partial top surface of the substrate is exposed. Thereby the apertures are formed. The part of the first contact region 42, however, may be positioned outside of the border of the first source region 34, by the mis-align generated during the aligning of mask pattern for the contact regions. Hence the impurity ions of the second conductive type is implanted into the first contact region 42, to form the second source region 48. Herein the impurity ions concentration and the diffusion depth of the second source 48 are similar to the concentration of and diffusion depth of the first source region 34. This results in, albeit the mis-align is generated, that the entire bottommost surface of the first contact region 42 is surrounded by the first and second source regions. As an example, the concentration of the substrate and the concentrations of the first and second source regions are respectively in the range of $10^{14}$–$10^{16}$ ions/cm$^3$, and $10^{18}$–$10^{21}$ ions/cm$^3$. Thereafter by known process, the stacked capacitor, comprising a first polysilicon layer 50, a dielectric layer 52 and a second polysilicon layer 54, and bit lines of metal layers are manufactured and the completed semiconductor memory device is achieved.

Figure 5:
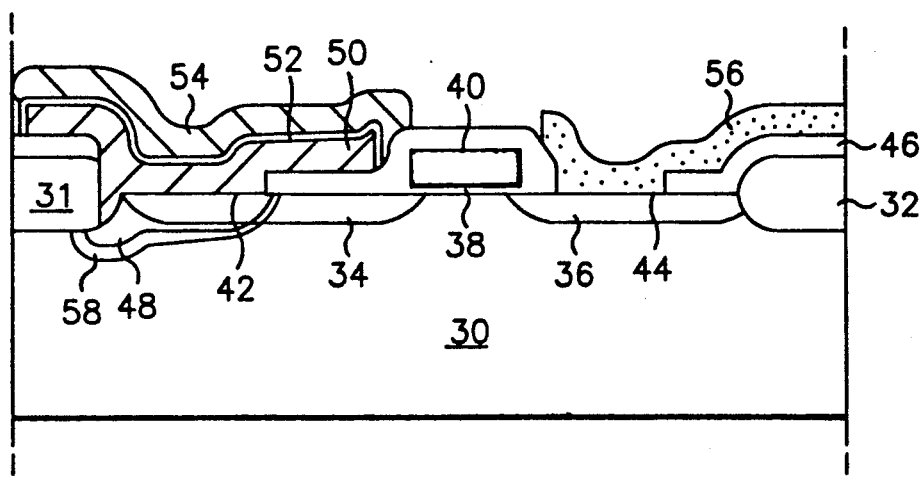
FIG. 5 illustrate another embodiment according to the present invention.

Referring to the FIG. 5 illustrating another embodiment according to the present invention, the second source region 48 partially overlapping the first source region 34 is formed by the ion-implantation, as shown in FIG. 4. Thereafter, the impurity ions of the first conductivity type are implanted toward the first contact region 42, in order to form a diffusion region 58 of the first conductivity type surrounding the second source region 48. The concentration of impurity ions of the diffusion region 58 corresponds to that between the concentration of the substrate and the concentration of the first or second source region. As an example, the concentration of the diffusion region 58 is employed in the range of $10^{16}$–$10^{19}$ ions/cm$^3$. The diffusion region 58 blocks, for electrons generated by the incident $\alpha$ particles into the substrate, to enter the storage node layer through the source regions in the substrate. Thereby the influence of the $\alpha$ particles on the storage electrode is suppressed.

Figure 6:
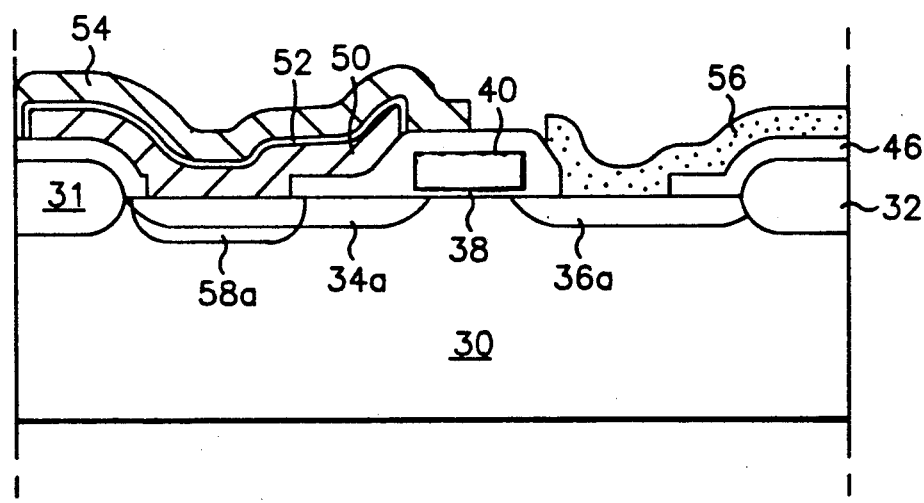
FIG. 6 illustrates still another embodiment according to the present invention.

FIG. 6 illustrates the cross sectional view of still another embodiment according to the present invention, wherein the DRAM cell does not have mis-align generated during the manufacture thereof, or density thereof is not high. In the above case, the second source region of FIGS. 4, 5 is not needed any more, because the contact region of the storage electrode is formed within the source region 34a. Accordingly the ion-implantation of the impurity having the conductivity type opposite to that of the source region 34a follows the ion-implantation for the source region 34a. Thereby a diffusion region 58a of the first conductivity type is formed. The concentration of the impurity of the diffusion region 58a must be lower and higher respectively than that of the source region and that of the substrate. In the present embodiment of FIG. 6, the concentration of the substrate is $10^{14}$–$10^{16}$ ions/cm$^3$, the source region is $10^{18}$–$10^{21}$ ions/cm$^3$, and the diffusion region 58a $10^{16}$–$10^{19}$ ions/cm$^3$.

In brief, when the contact region is formed on the source region, i.e., the first source region, and on the outside of the border thereof, because of the error produced during the mask align process for the contact region in the stacked capacitor of the semiconductor memory device, the impurity ions, having the same conductivity type as that of the first source region, are implanted into the substrate, to thus form a second source region. Thereby the entire junction surface between the contact region and the substrate, is surrounded. As a result, the leakage current, which flows through the weak junction between the part of the storage node and the substrate, is suppressed so that the refresh characteristic of the memory cell is improved. Further, in succession, impurity ions with the opposite conductive type to that of the second source region, are implanted into the substrate. Thereby the diffusion region, enclosing the entire bottommost surface of the second source region, is formed. Also in case of another embodiment having no align error, that is the contact region of the storage node is formed within the border of the source region, the impurity ions with the opposite conductivity type to that of the source region are implanted into the substrate, to form another diffusion region. The above respective diffusion region takes a role as a barrier or a block between the diffusion region and the substrate, to prevent electrons produced by the incident o particles into the substrate from entering the storage electrode, to thus drastically decrease the soft error rate. In conclusion, the high density semiconductor memory device having the accurate operation and high reliability can be achieved by improving the refresh characteristic and by decreasing the soft error rate.

While the present invention has been particularly shown and described with reference to the preferred embodiments thereof, it will be understood by those skilled in the art that the foregoing and other change in form and details may be made without departing from the spirit and scope of the invention.

What is claimed is:

1. A memory device, comprising:
a semiconductor substrate of a first conductivity type;
first and second diffusion regions of a second conductivity type by a channel region in said substrate;
a gate region formed on said channel region;

an element-isolation insulating layer spaced apart by a given distance from a selected one of said first and second diffusion regions;

an exposed substrate surface positioned between said element-isolation insulating layer and said selected one of said first diffusion region and said second diffusion region a stacked capacitor having a first conductive layer contacting said exposed substrate surface and a partial top surface of said selected one of said first diffusion region and said second diffusion region, and a second conductive layer having a second insulating layer serving as an interlayer, on said first conductive layer; and a third diffusion region of said second conductivity type formed under said exposed substrate surface under a junction surface between said first conductive layer one of said first diffusion region and said second diffusion region.

2. The memory device according to claim 1, further comprised a fourth diffusion region surrounds an entire bottommost surface of said third diffusion region.

3. The memory device according to claim 2, characterized in that a doping concentration of said fourth diffusion region is higher than a doping concentration of said semiconductor substrate and less than a doping concentration of said first, second, and third diffusion region.

4. A memory device, comprising:
a semiconductor substrate of a first conductivity type;
first and second diffusion regions of a second conductivity type isolated and spaced-apart from each other by a channel region;
a gate region having a first insulating layer serving as an interlayer formed on said channel region;
an element-isolation insulating layer spaced-apart by a given distance from elected one of said first diffusion region and said second diffusion region;
an exposed substrate surface positioned between said element-isolation insulating layer and said selected one of said first diffusion region and said second diffusion region; and
conductive means, positioned at a bottommost surface and in contact with said exposed substrate surface and a partial top surface of selected one of said first diffusion region and second diffusion region adjacent thereto; characterized
a third diffusion region said second conductivity type formed under said exposed substrate and under a junction surface between a selected one of said first diffusion region and said second diffusion region and said bottommost surface of said conductive means; and
a fourth diffusion region having a doping concentration higher than said semiconductor substate, surrounding an entire bottommost surface of said third diffusion region.

5. A memory device, comprising;
a semiconductor substrate of a first conductivity type;
first and second diffusion regions of a second conductivity type isolated and spaced-apart from each other by a channel region in said semiconductor substrate;
a gate region having a first insulating layer serving as an interlayer, formed on said channel region;
a stacked capacitor having a first conductive layer contacting top surfaces of a selected one of said first diffusion region and said second diffusion region and a second conductive layer including a second insulating layer serving as an interlayer, positioned on said first conductive layer; and, characterized a third diffusion region conductivity type formed under a junction surface between said selected one of said first diffusion region and said second diffusion region and said first conductive layer, said third diffusion region having a doping concentration greater than said semiconductor substrate and less than that of said first and second diffusion regions.

6. The memory device according to claim 5, wherein the doping concentration of said third diffusion region is approximately about $10^{16}$ to $10^{19}$ ions/cm$^3$, the doping cencentration of said semiconductor substrate is approximately about $10^{14}$ to $10^{16}$ ions/cm$^3$, and the doping concentration of said first and second diffusion regions is approximately about $10^{18}$ to $10^{21}$ ions/cm$^3$.

7. A memory cell, comprising:
a semiconductor substrate of a first conductivity type having a field oxide region for isolating adjacent memory cells;
a first source region of a second conductivity type and a drain region of a second conductivity type, formed within said semiconductor substrate and spaced-apart from each other by a channel region within said semiconductor substrate, said first source region being spaced-apart from said field oxide region by a given distance;
a stacked capacitor having successive layers of a first conductive layer, an insulating layer, and a second conductive layer on surfaces of said field oxide region and a substantial portion of said first source region; and
a second source region of said second conductivity type, situated in contact with said first conductive layer of said stacked capacitor within said given distance between said first source region and said field oxide region and overlapping a partial portion of said first source region and said field oxide region.

8. The memory cell as claimed in claim 7, further comprising said semiconductor substrate having a doping concentration of approximately $10^{14}$ to $10^{16}$ ions/cm$^3$.

9. The memory cell as claimed in claim 8, further comprising said first and second source regions having a doping concentration approximately $10^{18}$ to $10^{21}$ ions/cm$^3$.

10. The memory cell as claimed in claim 8, further comprising a third source region situated a surround an entire bottommost surface of said second source region having a doping concentration approximately about $10^{16}$ to $10^{19}$ ions/cm$^3$.

11. A memory cell, comprising:
a semiconductor substrate of a first conductivity type having a first doping concentration approximately $10^{14}$ to $10^{16}$ ions/cm$^3$;
a field oxide region situated on said semiconductor substrate, for isolating adjacent memory cells;
a first source region and a drain region of a second conductivity type having a second doping concentration situated adjacent to said field oxide region and spaced-apart from each other by a channel region in said semiconductor substrate;
a stacked capacitor having successive layers of a first conductive layer, an insulating layer, and a second conductive layer, disposed on surfaces of said field oxide region and a substantial portion of said first source region; and a second source region of said first conductivity type having a third doping concentration situated beneath a substantial position of said first source region and said stacked capacitor, and in contact with said first conductive layer of said stacked capacitor within an area between said field oxide region and said first source region, said third doping concentration being greater than said first doping concentration and less than said second doping concentration.

12. The memory cell as claimed in claim 11, wherein said first doping concentration is approximately $10^{14}$ to $10^{16}$ ions/cm$^3$, said second doping concentration approximately about $10^{18}$ to $10^{21}$ ions/cm$^3$, and said third doping concentration approximately about $10^{16}$ to $10^{19}$ ions/cm$^3$.

13. The memory cell as claimed in claim 3, further comprised of the doping concentration of said semiconductor substrate being approximately $10^{14}$ to $10^{16}$ ions/cm$^3$, the doping concentration of said first, second, and third diffusion regions being approximately about $10^{18}$ to $10^{21}$ ions/cm$^3$, and the doping concentration of said fourth diffusion region being approximately about $10^{16}$ to $10^{19}$ ions/cm$^3$.

* * * * *

UNITED STATES PATENT AND TRADEMARK OFFICE
CERTIFICATE OF CORRECTION

PATENT NO. : 5,208,470
DATED : 4 May 1993
INVENTOR(S) : Kyu-Pil Lee, et al.

It is certified that error appears in the above-indentified patent and that said Letters Patent is hereby corrected as shown below:

Column 1,

Line 13,     delete "10";

Column 2,

Line 27,     delete "10";

Column 4,

Line 50,     change "o" to --$\alpha$--;

IN THE CLAIMS

Column 4,

Line 67,     after "type", insert --isolated and spaced-apart from each other--;

Line 68,     after "gate region", insert --having a first insulating layer--;

UNITED STATES PATENT AND TRADEMARK OFFICE
CERTIFICATE OF CORRECTION

PATENT NO. : 5,208,470
DATED : 4 May 1993
INVENTOR(S) : Kyu-Pil Lee, et al.

It is certified that error appears in the above-indentified patent and that said Letters Patent is hereby corrected as shown below:

Column 5,

Line 28,     change "region" to --regions--;

Column 6,

Line 52,     change "situated a" to --situated to--;

Column 7,

Line 7,     change "position" to --portion--;

Signed and Sealed this

Sixteenth Day of August, 1994

Attest:

BRUCE LEHMAN

*Attesting Officer*      *Commissioner of Patents and Trademarks*